United States Patent
Zeng et al.

(10) Patent No.: US 10,210,044 B2
(45) Date of Patent: Feb. 19, 2019

(54) STORAGE CONTROLLER, DATA PROCESSING CHIP, AND DATA PROCESSING METHOD

(71) Applicant: Huawei Technologies Co., Ltd., Shenzhen (CN)

(72) Inventors: Yanxing Zeng, Hangzhou (CN); Jianqiang Shen, Hangzhou (CN); Gongyi Wang, Hangzhou (CN); Jinyi Zhang, Hangzhou (CN); Wen Lv, Hangzhou (CN)

(73) Assignee: Huawei Technologies Co., Ltd, Shenzhen (CN)

( * ) Notice: Subject to any disclaimer, the term of this patent is extended or adjusted under 35 U.S.C. 154(b) by 0 days.

(21) Appl. No.: 15/977,794

(22) Filed: May 11, 2018

(65) Prior Publication Data

US 2018/0260276 A1 Sep. 13, 2018

Related U.S. Application Data

(63) Continuation of application No. PCT/CN2016/111930, filed on Dec. 24, 2016.

(51) Int. Cl.
*G06F 11/00* (2006.01)
*G06F 11/10* (2006.01)
*G11B 20/18* (2006.01)
*G11C 29/00* (2006.01)
(Continued)

(52) U.S. Cl.
CPC ...... *G06F 11/1076* (2013.01); *G06F 11/1012* (2013.01); *G11B 20/1833* (2013.01); *G11C 29/88* (2013.01); *H03M 13/11* (2013.01); *H03M 13/373* (2013.01); *H03M 13/3761* (2013.01)

(58) Field of Classification Search
CPC ............. G06F 11/1012; G06F 11/1076; G11B 20/1833; G11C 29/88; H03M 13/11; H03M 13/373; H03M 13/3761
See application file for complete search history.

(56) References Cited

U.S. PATENT DOCUMENTS

| | | |
|---|---|---|
| 5,579,475 A | 11/1996 | Blaum et al. |
| 7,203,892 B2 | 4/2007 | Corbett et al. |
| 8,250,427 B2 | 8/2012 | Wylie et al. |

(Continued)

FOREIGN PATENT DOCUMENTS

| | | |
|---|---|---|
| CN | 102521067 A | 6/2012 |
| CN | 102739346 A | 10/2012 |

(Continued)

OTHER PUBLICATIONS

Xiang, L. et al., "Optimal Recovery of Single Disk Failure in RDP Code Storage Systems," SIGMETRICS '10, Jun. 14-18, 2010, 12 pages.

(Continued)

*Primary Examiner* — Jason B Bryan
(74) *Attorney, Agent, or Firm* — Slater Matsil, LLP

(57) ABSTRACT

This application discloses a storage controller. When running, the storage controller encodes, according to a check matrix, K to-be-coded data chunks obtained from a client, to generate two check chunks. In this way, if any chunk is damaged subsequently, the damaged chunk may be recovered by using the check matrix and an undamaged chunk.

20 Claims, 11 Drawing Sheets

(51) Int. Cl.
*H03M 13/11* (2006.01)
*H03M 13/37* (2006.01)

(56) References Cited

U.S. PATENT DOCUMENTS

| | | |
|---|---|---|
| 8,296,515 B1 | 10/2012 | Saxena et al. |
| 8,386,891 B2 | 2/2013 | Hetzler et al. |
| 8,677,208 B2 | 3/2014 | Wylie et al. |
| 8,990,495 B2 | 3/2015 | Hallak et al. |
| 9,058,291 B2 | 6/2015 | Blaum et al. |
| 9,495,246 B2 | 11/2016 | Gordon |
| 2004/0078643 A1 | 4/2004 | Ghosh et al. |
| 2008/0229170 A1* | 9/2008 | Laprade ............ H03M 13/2972 714/755 |
| 2010/0050045 A1* | 2/2010 | Chung ............... H03M 13/1102 714/752 |
| 2010/0251068 A1 | 9/2010 | Lin et al. |
| 2013/0086445 A1* | 4/2013 | Yedidia ............. H03M 13/1154 714/755 |
| 2013/0145231 A1* | 6/2013 | Frayer .................. H03M 13/13 714/763 |
| 2016/0218742 A1 | 7/2016 | Goker et al. |
| 2016/0274972 A1 | 9/2016 | Li et al. |
| 2017/0033804 A1 | 2/2017 | Li et al. |
| 2017/0255517 A1* | 9/2017 | Achtenberg .......... G06F 3/0619 |
| 2017/0255519 A1* | 9/2017 | Zhang ................ H04L 67/1097 |

FOREIGN PATENT DOCUMENTS

| | | |
|---|---|---|
| CN | 103761171 A | 4/2014 |
| CN | 104202057 A | 12/2014 |
| CN | 104461781 A | 3/2015 |
| CN | 104484126 A | 4/2015 |
| CN | 104850468 A | 8/2015 |
| CN | 104866243 A | 8/2015 |
| WO | 2016058289 A1 | 4/2016 |

OTHER PUBLICATIONS

EMC, "Xtremio Data Protection (XDP), Flash-Specific Data Protection, Provided by XtremeIO," (Ver. 3.0), Jul. 2014, 25 pages.
Chen, J. et al., "A New Zigzag MDS Code with Optimal Encoding and Efficient Decoding," 2014 IEEE International Conference on Big Data, Oct. 27, 2014, pp. 1-6.
Corbett, P. et al., "Row-Diagonal Parity for Double Disk Failure Correction," Proceedings of the Third USENIX Conference on File and Storage Technologies, (USENIX), San Francisco, CA, USA, Mar. 31-Apr. 2, 2004, pp. 1-15.

\* cited by examiner

| | Data chunk 1 | | | | Data chunk 2 | | | | Check chunk P | | | | Check chunk Q | | | |
|---|---|---|---|---|---|---|---|---|---|---|---|---|---|---|---|---|
| | <1-1> | <1-2> | <1-3> | <1-4> | <2-1> | <2-2> | <2-3> | <2-4> | <P-1> | <P-2> | <P-3> | <P-4> | <Q-1> | <Q-2> | <Q-3> | <Q-4> |
| Step 2.3 | 0 | 0 | 0 | 0 | 0 | 0 | 0 | 1 | 0 | 0 | 0 | 1 | 0 | 0 | 1 | 0 |
| Step 4.2 | 1 | 0 | 0 | 0 | 0 | 0 | 0 | 0 | 0 | 0 | 0 | 0 | 0 | 1 | 0 | 0 |
| Step 1.1 | 0 | 1 | 0 | 0 | 1 | 0 | 0 | 0 | 0 | 0 | 0 | 0 | 0 | 0 | 0 | 0 |
| Step 2.1 | 0 | 0 | 1 | 0 | 0 | 1 | 0 | 0 | 1 | 0 | 1 | 0 | 1 | 0 | 0 | 0 |
| Step 4.3 | 0 | 0 | 0 | 1 | 1 | 0 | 0 | 0 | 0 | 1 | 0 | 0 | 0 | 0 | 0 | 0 |
| Step 2.2 | 0 | 0 | 0 | 0 | 0 | 0 | 0 | 0 | 0 | 0 | 0 | 0 | 0 | 1 | 0 | 0 |
| Step 3.1 | 0 | 0 | 1 | 0 | 0 | 0 | 0 | 1 | 0 | 0 | 0 | 0 | 1 | 0 | 0 | 0 |
| Step 4.1 | 1 | 0 | 0 | 0 | 0 | 0 | 1 | 0 | 1 | 0 | 0 | 0 | 0 | 0 | 0 | 0 |

STORAGE CONTROLLER, DATA PROCESSING CHIP, AND DATA PROCESSING METHOD

CROSS-REFERENCE TO RELATED APPLICATIONS

This application is a continuation of International Application No. PCT/CN2016/111930, filed on Dec. 24, 2016, the disclosure of which is hereby incorporated by reference in its entirety.

TECHNICAL FIELD

This application relates to the field of storage technologies, and in particular, to a storage controller, a data processing chip, and a data processing method.

BACKGROUND

In a large-scale storage scenario, a storage system includes multiple storage media and storage controllers. A storage medium may include a hard disk drive (HDD), a solid state drive (SSD), or a combination of a hard disk drive and a solid state drive. A client sends to-be-written data to a storage controller using a communications network, and the storage controller processes the to-be-written data and stores the to-be-written data into a storage medium. An existing storage system generally uses a technology of redundant array of independent disks (RAID), and a core of the RAID technology is erasure code encoding and decoding technologies.

Efficiency of existing erasure code encoding and decoding technologies is relatively low.

SUMMARY

This application provides a storage controller, which may improve efficiency of erasure code encoding or decoding.

A first aspect of this application provides a storage controller, including a processor, a memory, and a communications interface. When the storage controller runs, the processor obtains K to-be-coded data chunks using the communications interface, and caches the K data chunks into the memory, where each data chunk includes R data code blocks, R+1 is a prime number, and R+1>K.

The processor continuously receives, using the communications interface, to-be-written data sent by a client, and caches the to-be-written data into the memory. After the memory caches a preset amount of to-be-written data, the processor divides the preset amount of to-be-written data into the K to-be-coded data chunks, where each data chunk is divided into the R data code blocks.

Subsequently, the processor is further configured to execute codes in the memory to perform the following operations: reading the K data chunks cached in the memory, and generating a first check chunk and a second check chunk according to a check matrix and the K data chunks, where each of the first check chunk and the second check chunk includes R check code blocks.

The check matrix includes $2*R$ rows. The $((k-1)*R+1)^{th}$ column to the $(k*R)^{th}$ column of the check matrix form a chunk column set of the $k^{th}$ data chunk in the K data chunks, where $K \geq k \geq 1$. The $(K*R+1)^{th}$ column to the $((K+1)*R)^{th}$ column of the check matrix form a chunk column set corresponding to the first check chunk, and the $((K+1)*R+1)^{th}$ column to the $((K+2)*R)^{th}$ column of the check matrix form a chunk column set of the second check chunk.

The check matrix is a standard check matrix H, or is obtained after N exchange operations are performed on a standard check matrix H, where $N \geq 1$, and the exchange operations refer to an exchange of any two chunk column sets. In the standard check matrix H, the following coordinates are 1 and the remaining coordinates are 0, $2*R \geq i \geq 1$, and $(K+2)*R \geq j \geq 1$, where if $i<j$, $H[i+1][j*R+(R-j+i) \bmod R+1]$, and $H[R+i+1][(j+1)*R(R-j+i) \bmod R]$; or if $i>j$, $H[i+1][j*R+(R-1-j+i) \bmod R+1]$, and $H[R+i+1][(j+1)*R-(R-1-j+i) \bmod R]$.

The check matrix may have two storage forms in the memory. A first storage form is a matrix with $2*R$ rows and $(K+2)*R$ columns. Because each row of the check matrix represents an exclusive OR equation, the check matrix represents $2*R$ exclusive OR equations. Therefore, a second storage form of the check matrix is the $2*R$ exclusive OR equations, and a matrix with $2*R$ rows and $(K+2)*R$ columns may also be obtained by using the $2*R$ exclusive OR equations.

With reference to the first aspect, in a first implementation of the first aspect, the $((k-1)*R+1)^{th}$ column to the $(k*R)^{th}$ column of the check matrix respectively correspond to the R data code blocks of the $k^{th}$ data chunk in the K data chunks, the $(K*R+1)^{th}$ column to the $((K+1)*R)^{th}$ column of the check matrix respectively correspond to the R check code blocks of the first check chunk, and the $((K+1)*R+1)^{th}$ column to the $((K+2)*R)^{th}$ column of the check matrix respectively correspond to the R check code blocks of the second check chunk. That is, each column of the check matrix corresponds to a data code block or a check code block.

There are three coordinates of 1 in a $D^{th}$ row of the check matrix, and the $D^{th}$ row is any row of the check matrix. The three coordinates of 1 correspond to three code blocks. An exclusive OR operation is performed on any two of the three code blocks corresponding to the coordinates of 1 in the $D^{th}$ row of the check matrix, to obtain a code block that does not participate in this exclusive OR operation and that is in the three code blocks corresponding to the coordinates of 1 in the $D^{th}$ row of the check matrix. That is, if the three coordinates of 1 in a specific row of the check matrix respectively correspond to a code block 1, a code block 2, and a code block 3, another code block may be obtained by performing the exclusive OR operation between any two of the code block 1, the code block 2, and the code block 3.

With reference to the first implementation of the first aspect, in a second implementation of the first aspect, the processor starts encoding from a start encoding row in a process of generating the first check chunk and the second check chunk according to the check matrix. The start encoding row is a row with only one coordinate of 1 in $2*R$ columns corresponding to the first check chunk and the second check chunk.

Because each row of the check matrix corresponds to one exclusive OR equation, and only $K*R$ data code blocks are known at the beginning of the encoding, the encoding can start only from the start encoding row. The check matrix includes four start encoding rows in total.

After an exclusive OR equation corresponding to a first start encoding row is completed (the first start encoding row is any one of the four start encoding rows), a check code block 1 is obtained. If the check code block 1 has only one coordinate of 1 in a column corresponding to the check matrix, an encoding process starting from the first start encoding row is completed. If the check code block 1 has two coordinates of 1 in a column corresponding to the check matrix, an encoding process jumps to a row that has not been used to generate a check code block and that is in rows in which the two coordinates are located. A check code block 2 is obtained by performing an exclusive OR equation corresponding to the jumped-to row. Processing performed on the check code block 1 is also performed on the check code block 2. If the check code block 2 has only one coordinate of 1 in a column corresponding to the check matrix, an encoding process starting from the first start encoding row is completed. If the check code block 2 has two coordinates of 1 in a column corresponding to the check matrix, an encoding process jumps to a row that has not been used to generate a check code block and that is in rows in which the two coordinates are located. A check code block 3 is obtained by performing an exclusive OR equation corresponding to the jumped-to row, and the processing performed on the check code block 1 is also performed on the check code block 2, and by analogy, until an encoding process starting from the first start encoding row is completed. The encoding process of the first start encoding row is performed on the four start encoding rows of the check matrix, and after coding processes starting from the four start encoding rows are completed, 2*R check code blocks are obtained.

With reference to the first aspect, or the first, or the second implementation of the first aspect, in a third implementation of the first aspect, after obtaining the first check chunk and the second check chunk according to the check matrix, the processor separately stores, using the communications interface, the K data chunks, the first check chunk, and the second check chunk into K+2 storage media in a storage system in which the storage controller is located. Generally, different chunks are stored into different storage media.

After the 2*R check code blocks are obtained, every R check code blocks form a check chunk, and the two check chunks and the K data chunks form a chunk group. The chunks in the chunk group are stored into the different storage media, so that when a storage medium is damaged subsequently, a chunk stored on the damaged storage medium can be recovered by using an undamaged chunk in the chunk group.

With reference to the third implementation of the first aspect, in a fourth implementation of the first aspect, after the K data chunks, the first check chunk, and the second check chunk are stored into the K+2 storage media in the storage system in which the storage controller is located, if a storage medium in the K+2 storage media is damaged, the processor recovers the damaged storage medium according to the check matrix, a data chunk that is stored on an undamaged storage medium in the K+2 storage media, and at least one of the first check chunk or the second check chunk.

If the data chunk is stored on the damaged storage medium, a damaged data chunk is recovered using K−1 data chunks and the two check chunks, where the K−1 data chunks and the two check chunks are stored on the remaining K+1 storage media. If the check chunk is stored on the damaged storage medium, a damaged check chunk is recovered using K data chunks and one check chunk, where the K data chunks and the one check chunk are stored on the remaining K+1 storage media.

In a recovery process, although each undamaged data chunk and each undamaged check chunk need to be used, there is no need to use each data code block in each undamaged data chunk and each check code block in each undamaged check chunk. Specific data code blocks and check code blocks that are used to recover a damaged chunk need to be determined according to exclusive OR equations that correspond to specific rows and in which corresponding columns of the damaged chunks in the check matrix participate.

Because of a strong coupling between a decoding process and an encoding process, the storage controller provided in the first aspect of this application reduces a recovery overhead, and improves efficiency during subsequent recovery of a damaged chunk by means of improvement in the encoding process.

A second aspect of this application provides a data processing chip, including a circuit and a read/write interface. The circuit is configured to obtain K to-be-coded data chunks using the read/write interface, where each data chunk includes R data code blocks, R+1 is a prime number, and R+1>K. The circuit is further configured to generate a first check chunk and a second check chunk according to a check matrix and the K data chunks, where each check chunk includes R check code blocks. The check matrix includes $2*R$ rows. The $((k-1)*R-1)^{th}$ column to the $(k*R)^{th}$ column of the check matrix form a chunk column set of the $k^{th}$ data chunk in the K data chunks, where $K \geq k \geq 1$. The $(K*R-1)^{th}$ column to the $((K+1)*R)^{th}$ column of the check matrix form a chunk column set corresponding to the first check chunk, and the $((K+1)*R-1)^{th}$ column to the $((K+2)*R)^{th}$ column of the check matrix form a chunk column set of the second check chunk. The check matrix is a standard check matrix H or is obtained after N exchange operations are performed on a standard check matrix H, where $N \geq 1$, and the exchange operation refers to an exchange of any two chunk column sets. In the standard check matrix H, the following coordinates are 1 and the remaining coordinates are 0, $2*R \geq i \geq 1$, and $(K+2)*R \geq j \geq 1$, where if $i<j$, $H[i+1][j*R+(R-j+i) \bmod R+1]$, and $H[R+i+1][(j+1)*R-(R \geq j+i) \bmod R]$; or if $i>j$, $H[i+1][j*R+(R-1-j+i) \bmod R+1]$, and $H[R+i+1][(j+1)*R-(R-1-j+i) \bmod R]$.

Specific implementations and achieved technical effects of the second aspect are similar to those of the first aspect, and details are not described herein again.

A third aspect of this application provides a data processing method. When working, the storage controller provided in the first aspect and the data processing chip provided in the second aspect perform the data processing method. The method includes: obtaining K to-be-coded data chunks and caching the K data chunks, where each data chunk includes R data code blocks, R+1 is a prime number, and R+1>K. The method also includes generating a first check chunk and a second check chunk according to a check matrix and the K data chunks. Each check chunk includes R check code blocks. The check matrix includes 2*R rows. The $((k-1)*R+1)^{th}$ column to the $(k*R)^{th}$ column of the check matrix form a chunk column set of the $k^{th}$ data chunk in the K data chunks, where K≥k≥1. The $(K*R+1)^{th}$ column to the $((K+1)*R)^{th}$ column of the check matrix form a chunk column set corresponding to the first check chunk, and the $((K+1)*R+1)^{th}$ column to the $((K+2)*R)^{th}$ column of the check matrix form a chunk column set of the second check chunk. The check matrix is a standard check matrix H or is obtained after N exchange operations are performed on a standard check matrix H, where N≥1, and the exchange operation refers to an exchange of any two chunk column sets. In the standard check matrix H, the following coordinates are 1 and the remaining coordinates are 0, 2*R≥i≥1, and (K+2)*R≥j≥1, where if $i<j$, $H[i+1][j*R+(R-j+i) \bmod R+1]$, and $H[R+i+1][(j+1)*R(R-j+i) \bmod R]$; or if $i>j$, $H[i+1][j*R+(R-1-j+i) \bmod R+1]$, and $H[R+i+1][(j+1)*R-(R-1-j+i) \bmod R]$.

With reference to the third aspect, in a first implementation of the third aspect, the $((k-1)*R+1)^{th}$ column to the $(k*R)^{th}$ column of the check matrix respectively correspond to the R data code blocks of the $k^{th}$ data chunk in the K data chunks. The $(K*R+1)^{th}$ column to the $((k-1)*R+1)^{th}$ column of the check matrix respectively correspond to the R check code blocks of the first check chunk, and the $((K+1)*R+1)^{th}$ column to the $((K+2)*R)^{th}$ column of the check matrix respectively correspond to the R check code blocks of the second check chunk. There are three coordinates of 1 in a $D^{th}$ row of the check matrix, where the $D^{th}$ row is any row of the check matrix, and an exclusive OR operation is performed on any two of three code blocks corresponding to the coordinates of 1 in the $D^{th}$ row of the check matrix, to obtain a code block that does not participate in this exclusive OR operation and that is in the three code blocks corresponding to the coordinates of 1 in the $D^{th}$ row of the check matrix.

With reference to the first implementation of the third aspect, in a second implementation of the third aspect, encoding starts from a start encoding row in a process of generating the first check chunk and the second check chunk according to the check matrix. The start encoding row is a row with only one coordinate of 1 in 2*R columns corresponding to the first check chunk and the second check chunk.

After an exclusive OR equation corresponding to a first start encoding row is completed (the first start encoding row is any one of four start encoding rows), a check code block 1 is obtained. If the check code block 1 has only one coordinate of 1 in a column corresponding to the check matrix, an encoding process starting from the first start encoding row is completed. If the check code block 1 has two coordinates of 1 in a column corresponding to the check matrix, an encoding process jumps to a row that has not been used to generate a check code block and that is in rows in which the two coordinates are located. A check code block 2 is obtained by performing an exclusive OR equation corresponding to the jumped-to row. Processing performed on the check code block 1 is also performed on the check code block 2. If the check code block 2 has only one coordinate of 1 in a column corresponding to the check matrix, an encoding process starting from the first start encoding row is completed. If the check code block 2 has two coordinates of 1 in a column corresponding to the check matrix, an encoding process jumps to a row that has not been used to generate a check code block and that is in rows in which the two coordinates are located. A check code block 3 is obtained by performing an exclusive OR equation corresponding to the jumped-to row, and the processing performed on the check code block 1 is also performed on the check code block 2, and by analogy, until an encoding process starting from the first start encoding row is completed. The encoding process of the first start encoding row is performed on the four start encoding rows of the check matrix, and after encoding processes starting from the four start encoding rows are completed, 2*R check code blocks are obtained.

With reference to the third aspect, or the first, or the second implementation of the third aspect, in a third implementation of the third aspect, the method further includes separately storing the K data chunks, the first check chunk, and the second check chunk into K+2 storage media in a storage system in which the storage controller that performs the data processing method is located.

With reference to the third implementation of the third aspect, in a fourth implementation of the third aspect, the method further includes: when a storage medium in the K+2 storage media in the storage system in which the storage controller is located is damaged, recovering the damaged storage medium according to the check matrix, a data chunk that is stored on an undamaged storage medium in the K+2 storage media, and at least one of the first check chunk or the second check chunk.

According to the data processing method provided in the third aspect of this application, a recovery overhead may be reduced, and efficiency during subsequent recovery of a damaged chunk may be improved by means of improvement in the encoding process.

A fourth aspect of this application provides a storage medium, where the storage medium stores a program, and when the program runs on a computing device, the computing device performs the data processing method provided in any one of the third aspect or the implementations of the third aspect. The storage medium includes, but is not limited to a read-only memory, a random access memory, a flash memory, an HDD, or an SSD.

A fifth aspect of this application provides a computer program product, where the computer program product includes a program instruction, and when the computer program product is executed by a computer, the computer performs the data processing method provided in any one of the third aspect or the implementations of the third aspect. The computer program product may be a software installation package, and when the data processing method provided in any one of the third aspect or the implementations of the third aspect needs to be used, the computer program product may be downloaded, and the computer program product may be executed on a computing device.

BRIEF DESCRIPTION OF THE DRAWINGS

To describe the technical solutions in the embodiments of this application more clearly, the following briefly describes the accompanying drawings required for the embodiments.

FIG. 1-2 is a schematic structural composition diagram of another storage system according to an embodiment of this application;

FIG. 3A and FIG. 3B are a schematic structural diagram of a check matrix according to an embodiment of this application;

FIG. 4-1 is a schematic structural diagram of another check matrix according to an embodiment of this application;

FIG. 4-2 is a schematic structural diagram of still another check matrix according to an embodiment of this application;

FIG. 5 is a schematic structural diagram of yet another check matrix according to an embodiment of this application;

DETAILED DESCRIPTION OF ILLUSTRATIVE EMBODIMENTS

The following describes the technical solutions in the embodiments of this application with reference to the accompanying drawings in the embodiments of this application.

In this application, there is no logical or time-sequence dependency among the "first", the "second", and the "$n^{th}$".

In this specification, an exclusive OR (XOR) operation between two code blocks indicates that the exclusive OR operation is successively performed on all bits of the two code blocks. For example, the exclusive OR operation is performed on the first bit of a code block 1 and the first bit of a code block 2 to obtain the first bit of a code block 3, and by analogy, until the exclusive OR operation is performed on the last bit of the code block and the last bit of the code block 2 to obtain the last bit of the code block 3. The code block 3 is obtained by performing the exclusive OR operation between the code block 1 and the code block 2.

In this specification, a recovery overhead is a parameter used to measure a storage medium access overhead that is required to recover a damaged storage medium when any storage medium that stores data in a chunk group and that is in K+2 storage media is damaged. The recovery overhead is equal to a ratio of a size of a code block that is read from an undamaged storage medium to a total size of all data code blocks in the chunk group during recovery of the damaged storage medium. Therefore, a lower recovery overhead indicates a shorter recovery time required when the storage medium is damaged. A definition of the chunk group is described in detail in the following.

In this specification, mod is a modulo function, that is, A mod B indicates a remainder obtained by dividing A by B, where A and B are integers, for example, 4 mod 3=1.

An architecture applied in an embodiment of this application is as follows.

Figure 1:
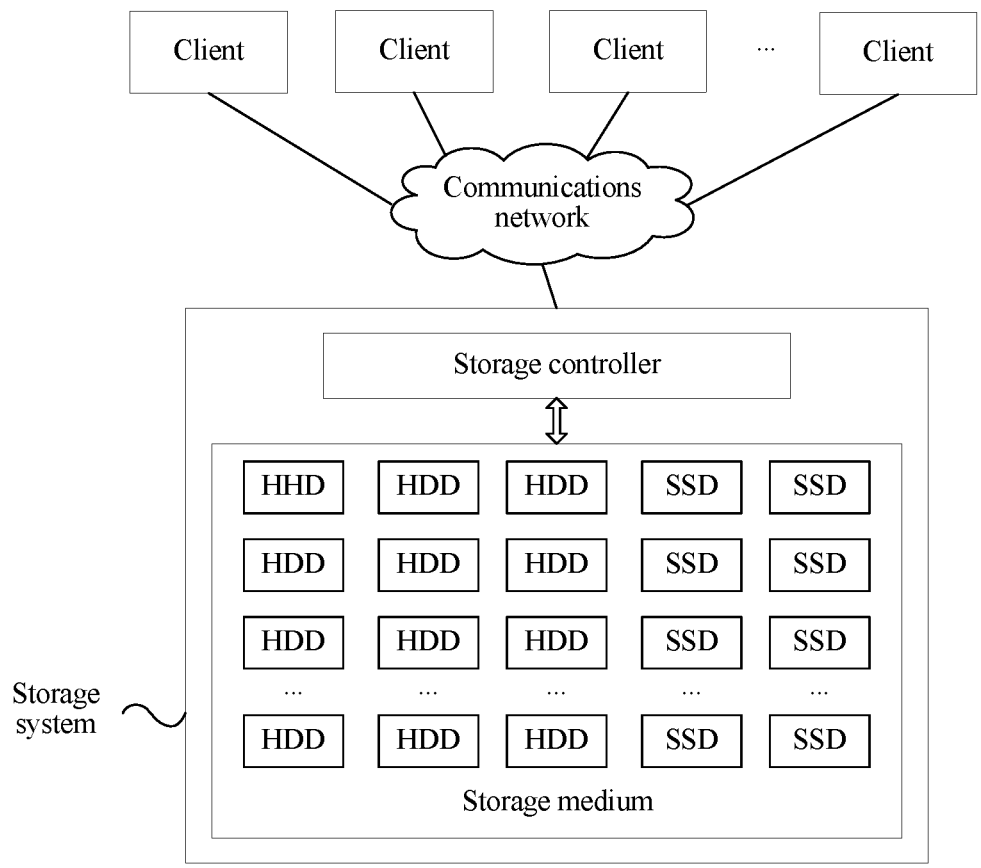
FIG. 1-1 is a schematic structural composition diagram of a storage system according to an embodiment of this application.
Figures 1, 2:
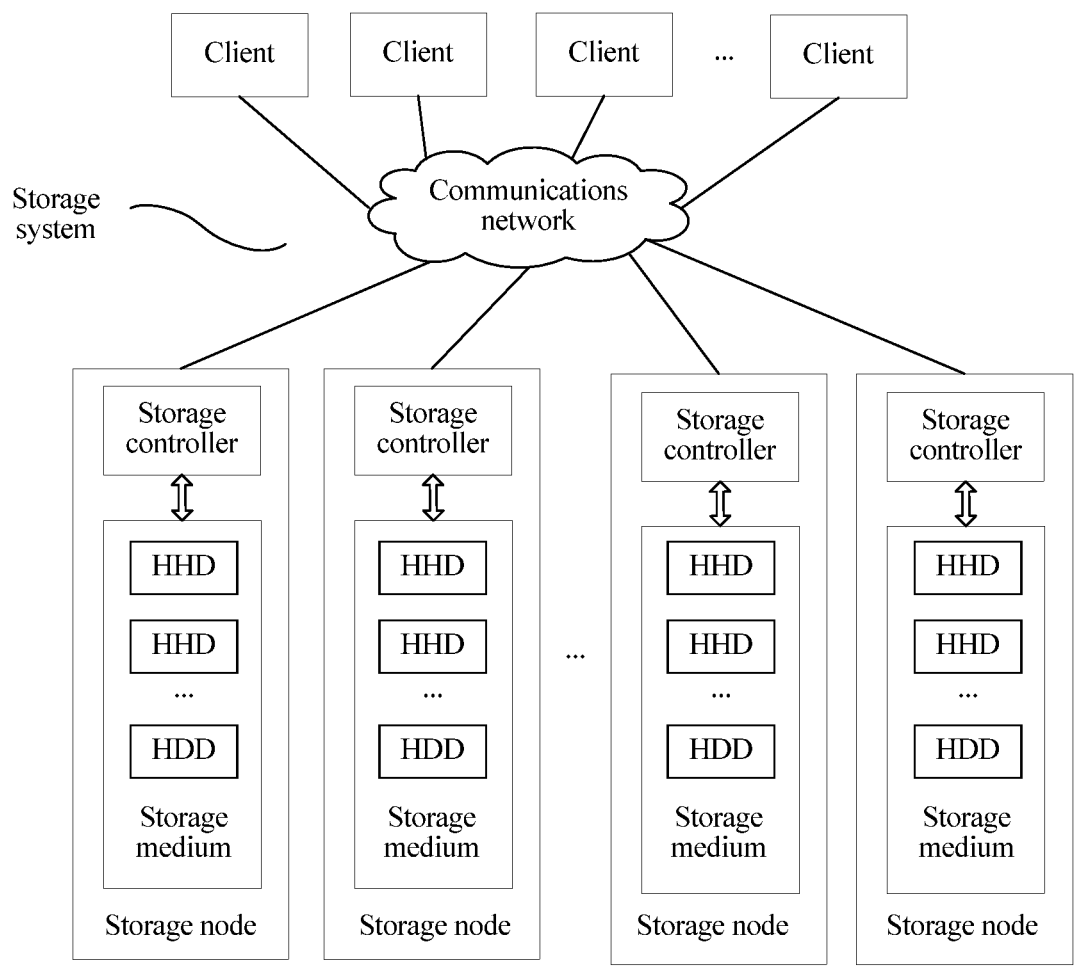

As shown in FIG. 1-1 and FIG. 1-2, two storage systems with different architectures are described. A storage system in FIG. 1-1 is also referred to as a storage array, and both a storage controller and a storage medium are located inside the storage array. FIG. 1-2 shows a distributed storage system. The storage system includes multiple storage nodes, and each storage node may be actually a server. At least one storage node in the storage system includes a storage controller, each storage node includes a storage medium, and all the storage nodes establish communications connection to each other using a communications network.

The storage controller in the storage array in FIG. 1-1 processes only to-be-written data sent by a client to the storage array. All the storage controllers in FIG. 1-2 may receive to-be-written data sent by a client and perform erasure code encoding and decoding processing on the to-be-written data. Data obtained after a storage controller performs encoding can not only be stored into a storage medium on a storage node on which the storage controller is located, but also be sent to a storage medium on another storage node using the communications network, so as to implement distributed storage. Because multiple storage controllers may concurrently work in the distributed storage system, each storage controller in the multiple storage controllers is responsible for a storage node group in the storage system, and each storage node group includes at least one storage node. The storage controller in the storage node group is responsible for receiving the to-be-written data sent by the client, performing encoding on the to-be-written data, and storing the to-be-written data into the storage node in the storage node group. The following storage controller may be any storage controller in FIG. 1-1 or FIG. 1-2, and the storage controller is configured to perform erasure code encoding and decoding.

Figure 2A:
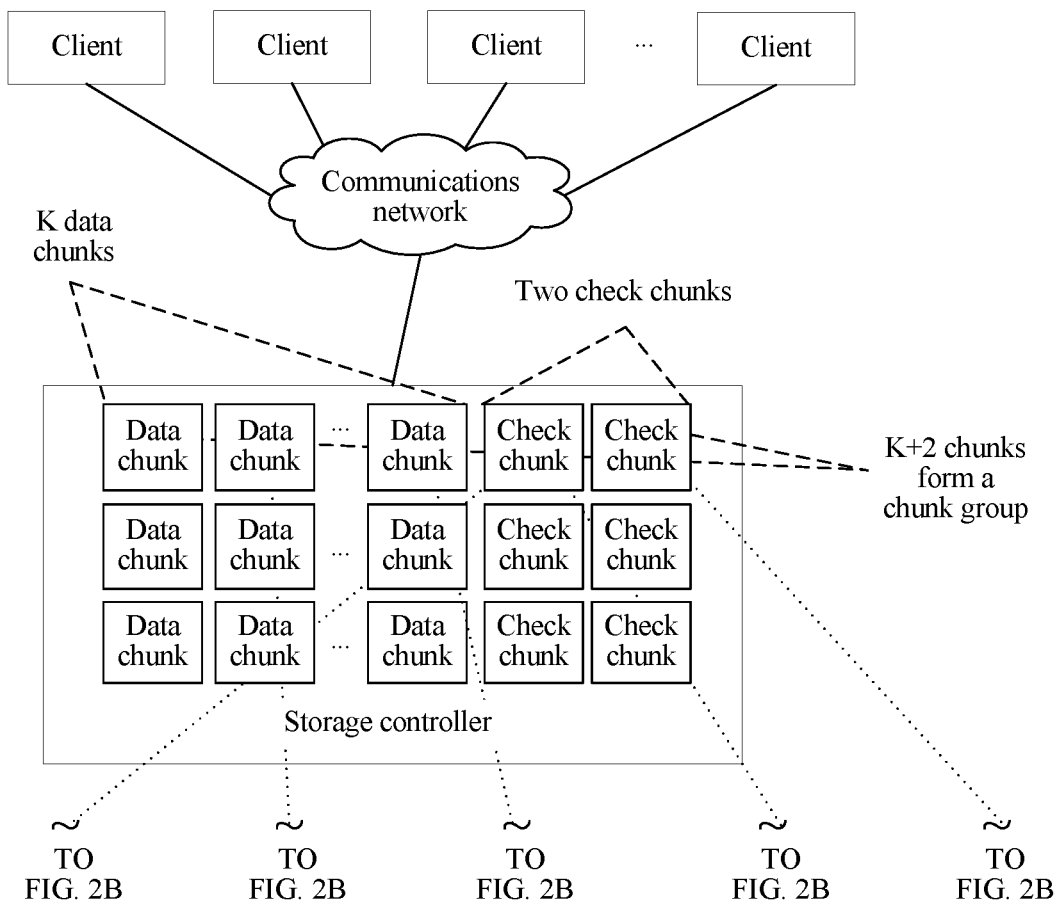
FIG. 2A and FIG. 2B are a schematic structural composition diagram of still another storage system according to an embodiment of this application.
Figure 2B:
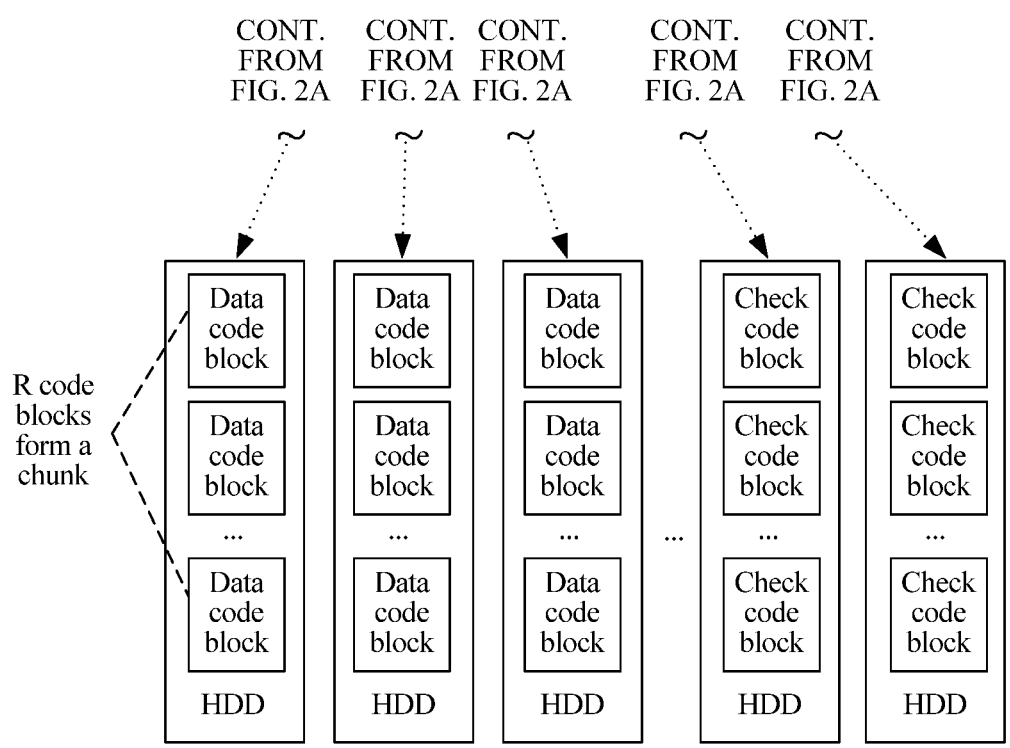

As shown in FIG. 2A and FIG. 2B, in a running process of a storage system, a storage controller continuously receives to-be-written data sent by a client, and after receiving a preset amount of to-be-written data, the storage controller divides the preset amount of to-be-written data into K to-be-coded data chunks, where each data chunk is divided into R data code blocks, and generates two check chunks according to the K*R data code blocks and an erasure code encoding method, where each check chunk includes R check code blocks. Every K data chunks and check chunks generated using the K data chunks form a chunk group. A size of each chunk may be set according to a requirement, for example, 512 bytes, 4 k bytes, 8 k bytes, and 32 k bytes.

After generating a chunk group, the storage controller stores each chunk in the chunk group into one SSD; a similar operation is performed when a storage medium used in the storage system is an HDD or a device of another type. After storing each chunk in the chunk group into a corresponding SSD, the storage controller continues to form another chunk group by using the to-be-written data sent by the client, and performs storage in a similar manner.

On the SSD, each chunk is divided into R code blocks for storage. In FIG. 2A and FIG. 2B, a code block corresponding to a data chunk is referred to as a data code block, and a code block corresponding to a check chunk is referred to as a check code block. Although all the R code blocks in each chunk are stored on a same SSD, storage addresses (which may be physical storage addresses or logical storage addresses) of the R code blocks may be discontinuous. Generally, sizes of all code blocks in a chunk group are the same. R and K need to meet the following condition: R−1 is a prime number, and R−1>K, where both R and K are positive integers. R is generally a configuration parameter of the storage system, and K is generally a parameter set by a user. To meet different requirements of the user, the storage controller has erasure code encoding and decoding methods to adapt to different configurations of K and R.

If any SSD is damaged, the remaining chunks in a chunk group to which a chunk on the damaged SSD belongs need to be used to recover the chunk on the damaged SSD, and the erasure code decoding method needs to be used in a recovery process.

Each check code block is obtained by performing an exclusive OR operation on two code blocks from two different chunks. The two chunks may be one data chunk and one check chunk, or the two chunks are data chunks. The storage controller determines, in a process of generating the check chunk and using a check matrix preset in the storage controller, two specific code blocks on which the operation is performed to obtain each check code block in 2*R check code blocks.

Because of a feature of the exclusive OR operation, the remaining one code block may be obtained by performing the exclusive OR operation on any two code blocks in a check code block and two code blocks that are used to generate the check code block. Therefore, when any SSD is damaged, the storage controller may also learn, using the check matrix, two specific code blocks on which the operation may be performed to obtain each code block in a chunk stored on the damaged SSD.

Figure 3A:
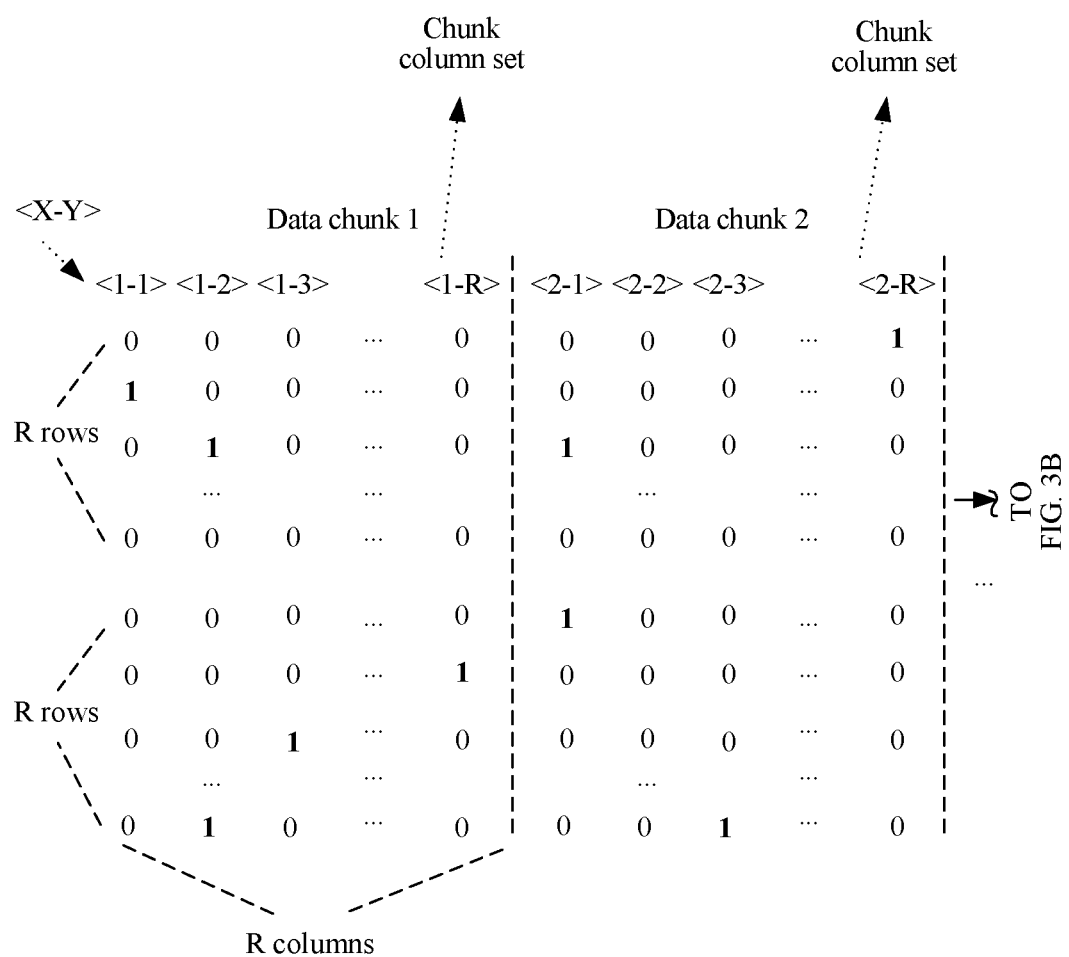
Figure 3B:
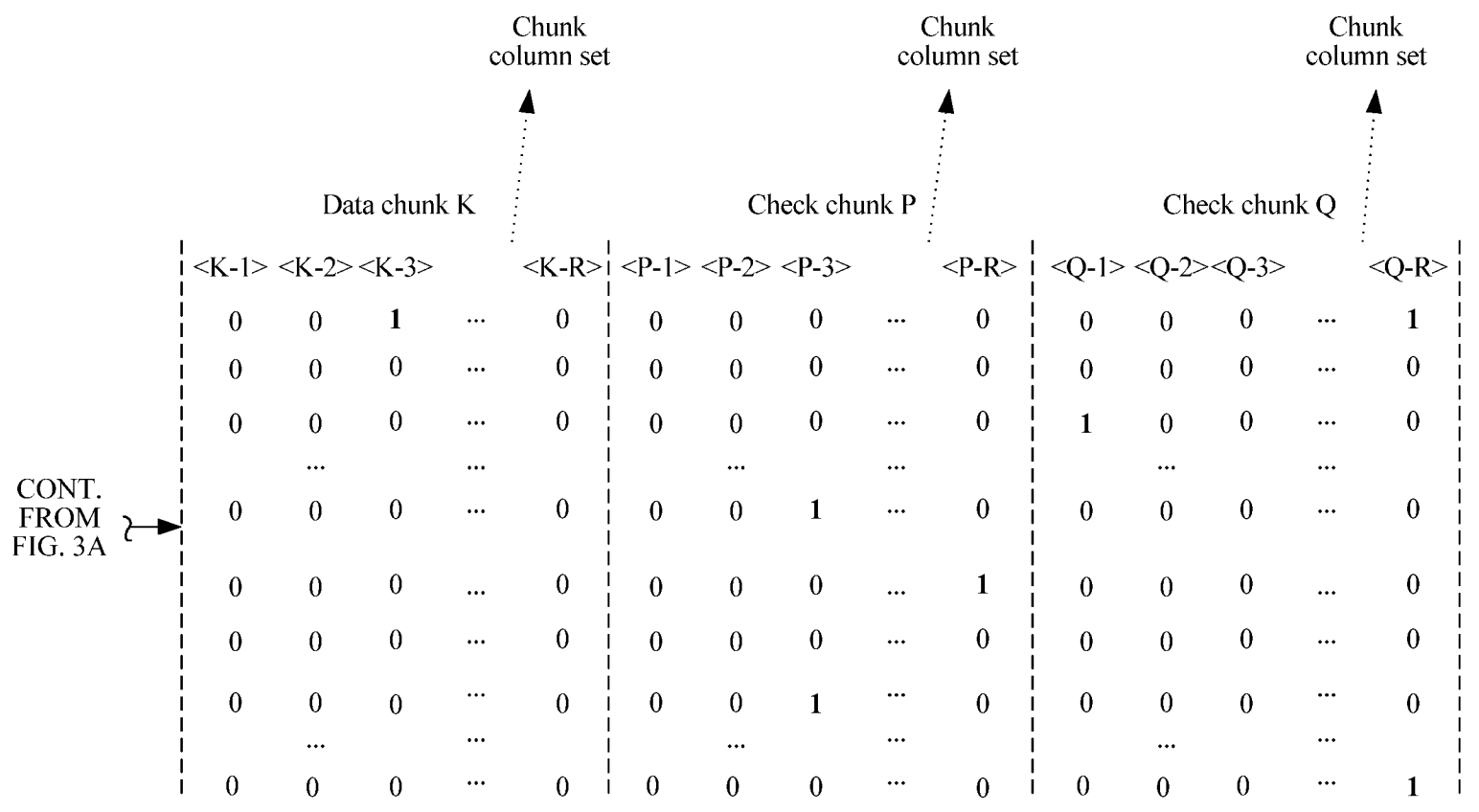

The check matrix includes 2*R rows and (K+2)*R columns. Each column of the check matrix corresponds to one code block, and each row of the check matrix corresponds to one exclusive OR equation. As shown in FIG. 3A and FIG. 3B, X-Y represents the $Y^{th}$ code block in a data chunk X, and is referred to as a data code block X-Y in the following, where K≥X≥1, and R≥Y≥1. Two check chunks are respectively referred to as a check chunk P and a check chunk Q. Therefore P-Y represents the $Y^{th}$ code block in the check chunk P and is referred to as a check code block P-Y in the following, and Q-Y represents the $Y^{th}$ code block in the check chunk Q and is referred to as a check code block Q-Y, where R≥Y≥1.

R columns corresponding to each chunk in a check matrix are collectively referred to as a chunk column set. Therefore, there are K+2 chunk column sets in total in the check matrix with 2*R rows and (K+2)*R columns. The first to the $R^{th}$ columns of the check matrix belong to a chunk column set corresponding to a data chunk 1, and the $(R+1)^{th}$ to the $(2R)^{th}$ columns of the check matrix belong to a chunk column set corresponding to a data chunk 2; and by analogy, the $(K*R+1)^{th}$ to the $((K+1)*R)^{th}$ columns of the check matrix belong to a chunk column set corresponding to a check chunk P, and the $((K+1)*R)^{th}$ to the $((K+2)*R)^{th}$ columns of the check matrix belong to a chunk column set corresponding to a check chunk Q.

There are three coordinates of 1 in each row of the check matrix. This indicates that another code block may be obtained by performing an exclusive OR operation between any two of three code blocks corresponding to the three coordinates. As shown in FIG. 3A and FIG. 3B, the first row of the check matrix indicates that by performing an exclusive OR operation between any two of a data code block 2-R, a data code block K-3, and a check code block Q-R, a code block that does not participate in the exclusive OR operation may be obtained. It should be noted that FIG. 3A and FIG. 3B merely show an example of a structure of the check matrix.

A check matrix applied in an embodiment of this application.

The check matrix applied in this embodiment of this application may be a standard check matrix H, or is obtained after N exchange operations are performed on a standard check matrix H, where N≥1. An exchange operation refers to an exchange of any two chunk column sets in a matrix with 2*R rows and (K+2)*R columns. Because 2*R exclusive OR equations are actually provided in the standard check matrix H, and each exclusive OR equation is used to obtain one check code block, 2*R check code blocks may still be obtained in the matrix obtained after the N exchange operations are performed on the standard check matrix H.

The standard matrix H meets the following condition: 2*R≥i≥1, and (K+2)*R≥j≥1 in the following formulas, where if $i<j$, $$H[i+1][j*R+(R-j+i) \bmod R+1]=1 \qquad \text{formula 1, and}$$

$$H[R+i+1][(j+1)*R-(R-j+i) \bmod R]=1 \qquad \text{formula 2, or}$$

if $i>j$, $$H[i+1][j*R+(R-1-j+i) \bmod R+1]=1 \qquad \text{formula 3, and}$$

$$H[R+i+1][(j+1)*R(R-1-j+i) \bmod R]=1 \qquad \text{formula 4.}$$

The remaining coordinates in the standard check matrix H are 0 except coordinates indicated by the formula 1 to the formula 4.

FIG. 4-1 shows a standard matrix H obtained when K=2 and R=4. FIG. 4-2 shows a check matrix obtained after a chunk column set corresponding to a data chunk 1 in the standard matrix H is exchanged with a chunk column set corresponding to a data chunk 2 in the standard matrix H. It can be learned that content of the first column to the fourth column of the standard matrix H provided in FIG. 4-1 is exchanged to the fifth column to the eighth column of the check matrix provided in FIG. 4-2, and content of the fifth column to the eighth column of the standard matrix H provided in FIG. 4-1 is exchanged to the first column to the fourth column of the check matrix provided in FIG. 4-2. In the check matrix provided in FIG. 4-2, the first column to the fourth column still correspond to four data code blocks in the data chunk 1, and the fifth column to the eighth column still correspond to four data code blocks of the data chunk 5.

An encoding process is described in the following.

First, encoding is performed from a start encoding row of the check matrix.

The start encoding row is a row with only one coordinate of 1 in 2*R columns corresponding to two check chunks in the check matrix. Because each row of the check matrix corresponds to one exclusive OR equation, and only K*R data code blocks are known at the beginning of the encoding, the encoding can start only from the start encoding row.

Each check matrix includes four start encoding rows. Encoding processes corresponding to the four start encoding rows do not interfere with each other, and may be concurrently performed in actual use.

An encoding process of a start encoding row 1 is as follows.

Step 1: Perform, according to a start encoding row 1, an exclusive OR operation to obtain a check code block 1.

Step 2: If the check code block 1 participates in only one exclusive OR equation, that is, only one coordinate in a column in which the check code block 1 is located is 1, end encoding starting from the start encoding row 1.

Step 3: If the check code block 1 participates in two exclusive OR equations, that is, two coordinates in a column in which the check code block 1 is located are 1, perform, according to the two exclusive OR equations in which the check code block 1 participates, coding in a row in which an exclusive OR equation that is not used in step 2 is located, to obtain a check code block 2.

Step 2 or step 3 continues to be performed on the check code block 2. That is, if the check code block 2 participates in only one exclusive OR equation, that is, only one coordinate in a column in which the check code block 2 is located is 1, coding starting from the start encoding row 1 ends. If the check code block 2 participates in two exclusive OR equations, that is, two coordinates in a column in which the check code block 2 is located are 1, encoding is performed, according to the two exclusive OR equations in which the check code block 2 participates, in the row in which the exclusive OR equation that is not used in step 2 is located, to obtain a check code block 3.

Step 2 or step 3 continues to be performed on the check code block 3. By analogy, only after a check code block obtained after encoding participates in only one exclusive OR equation, encoding starting from the start encoding row 1 ends.

The start encoding row 1 is any one of the four start encoding rows of a check matrix.

The encoding process of the foregoing start encoding row 1 is performed on the four start encoding rows of the check matrix to obtain 2*R check code blocks, and then a storage controller obtains all data chunks and check chunks.

For example, K=2, R=4, and a standard check matrix is used. As shown in FIG. 5, in the third, the fourth, the seventh, and the eighth rows, only one coordinate in 2*R columns corresponding to a check chunk P and a check chunk Q is 1. Therefore, the third, the fourth, the seventh, and the eighth rows are start encoding rows of the check matrix.

Coding is performed according to the third row:

Step 1.1: A data code block 1-2 XOR a data code block 2-1=a check code block Q-4.

It can be learned from the sixteenth column of the standard check matrix that the check code block Q-4 participates in only one exclusive OR equation, and therefore encoding starting from the third row ends.

Coding is performed according to the fourth row.

Step 2.1: A data code block 1-3 XOR a data code block 2-2=a check code block P-1.

It can be learned from the ninth column of the standard check matrix that the check code block P-1 participates in two exclusive OR equations respectively corresponding to the fourth row and the sixth row of the standard check matrix, and therefore encoding is performed next according to the sixth row:

Step 2.2: A data code block 1-4 XOR the check code block P-1=a check code block Q-2.

It can be learned from the fourteenth column of the standard check matrix that the check code block Q-2 participates in two exclusive OR equations respectively corresponding to the sixth row and the first row of the standard check matrix, and therefore encoding is performed next according to the first row.

Step 2.3: A data code block 2-4 XOR the check code block Q-2=a check code block P-3.

It can be learned from the eleventh column of the standard check matrix that the check code block P-3 participates in only one exclusive OR equation, and therefore encoding starting from the fourth row ends.

Coding is performed according to the seventh row.

Step 3.1: The data code block 1-3 XOR a data code block 2-4=a check code block Q-1.

It can be learned from the thirteenth column of the standard check matrix that the check code block Q-1 participates in only one exclusive OR equation, and therefore encoding starting from the seventh row ends.

Coding is performed according to the eighth row.

Step 4.1: The data code block 1-2 XOR a data code block 2-3=a check code block P-4.

It can be learned from the twelfth column of the standard check matrix that the check code block P-4 participates in two exclusive OR equations respectively corresponding to the second row and the eighth row of the standard check matrix, and therefore encoding is performed next according to the second row.

Step 4.2: A data code block 1-1 XOR the check code block P-4=a check code block Q-3.

It can be learned from the fifteenth column of the standard check matrix that the check code block Q-3 participates in two exclusive OR equations respectively corresponding to the second row and the fifth row of the standard check matrix, and therefore encoding is performed next according to the fifth row.

Step 4.3: A data code block 2-1 XOR the check code block Q-3=a check code block P-2.

It can be learned from the tenth column of the standard check matrix that the check code block P-2 participates in only one exclusive OR equation, and therefore encoding starting from the eighth row ends.

Now encoding of the four start encoding rows ends. The check code block P-1 to the check code block Q-4 have all been obtained by means of coding, and therefore the storage controller generates a chunk group corresponding to a data chunk 1 and a data chunk 2.

A decoding process is described in the following.

After the storage controller obtains, by performing the foregoing encoding process, a chunk group corresponding to a to-be-stored data chunk and stores the chunk group into K+2 SSDs, if an SSD in the K+2 SSDs is damaged, an erasure code decoding method needs to be used to recover a data chunk or a check chunk stored on the damaged SSD. Specifically, the damaged SSD may be detected by the storage controller, or the storage controller is notified that the SSD in the K+2 SSDs is damaged.

If only one SSD in the K+2 SSDs is damaged, only one chunk in the chunk group needs to be recovered. A recovery process of each code block in the damaged chunk is as follows, wherein a code block 1 is any one of R code blocks in the damaged chunk, obtaining, according to the check matrix, an exclusive OR equation in which the code block 1 participates, and obtaining, according to the exclusive OR equation in which the code block 1 participates, the remaining two code blocks used to recover the code block 1; and performing an exclusive OR operation on the remaining two code blocks to obtain the code block 1.

Because R-2 code blocks in the R code blocks in any chunk participate in two exclusive OR equations, and each code block that participates in the two exclusive OR equations may use, in the recovery process, either of the two exclusive OR equations in which said each code block participates, there may be actually $2^{R-2}$ decoding methods.

Although recovery of the damaged chunk may be completed using the $2^{R-2}$ decoding methods, the two code blocks used to recover the code block 1 need to be read from the SSD into the storage controller in the recovery process of the code block 1, and then the recovery process is completed by the storage controller. Because of different decoding methods, quantities of code blocks that need to be read from the SSD are different in the recovery process of all the R code blocks. Therefore, when any chunk is damaged, a decoding method with a minimal quantity of code blocks that need to be read from the SSD may be used in a determined check matrix.

As shown in FIG. 4-1, that K=2, R=4, and a standard check matrix is used is still used as an example.

If an SSD in which a data chunk 1 is located is damaged, a data code block 1-1, a data code block 1-2, a data code block 1-3, and a data code block 1-4 need to be recovered.

The data code block 1-1 participates in only one exclusive OR equation corresponding to the second row of the check matrix:

The data code block 1-1=a check code block P-4 XOR a check code block Q-3.

The data code block 1-2 participates in exclusive OR equations corresponding to the third row of the check matrix and the eighth row of the check matrix:

The data code block 1-2=a data code block 2-1 XOR a check code block Q-4; and the data code block 1-2=a data code block 2-3 XOR a check code block P-4.

The data code block 1-3 participates in exclusive OR equations corresponding to the fourth row of the check matrix and the seventh row of the check matrix:

The data code block 1-3=a data code block 2-2 XOR a check code block P-1; and the data code block 1-3=a data code block 2-4 XOR a check code block Q-1.

The data code block 1-4 participates in only one exclusive OR equation corresponding to the sixth row of the check matrix:

The data code block 1-4=the check code block P-1 XOR a check code block Q-2.

Because both the data code block 1-2 and the data code block 1-3 participate in two exclusive OR equations, there are $2^2$=4 decoding methods in total.

Decoding method 1: recovering the data code block 1-2 by using the exclusive OR equation corresponding to the third row of the check matrix, and recovering the data code block 1-3 by using the exclusive OR equation corresponding to the fourth row of the check matrix.

A recovery overhead=(the check code block P-4, the check code block Q-3, the data code block 2-1, the check code block Q-4, the data code block 2-2, the check code block P-1, and the check code block Q-2)/8 data code blocks=0.875.

Decoding method 2: recovering the data code block 1-2 by using the exclusive OR equation corresponding to the eighth row of the check matrix, and recovering the data code block 1-3 using the exclusive OR equation corresponding to the fourth row of the check matrix.

A recovery overhead=(the check code block P-4, the check code block Q-3, the data code block 2-3, the data code block 2-2, the check code block P-1, and the check code block Q-2)/8 data code blocks=0.75.

Decoding method 3: recovering the data code block 1-2 by using the exclusive OR equation corresponding to the third row of the check matrix, and recovering the data code block 1-3 by using the exclusive OR equation corresponding to the seventh row of the check matrix:

A recovery overhead=(the check code block P-4, the check code block Q-3, the data code block 2-1, the check code block Q-4, the data code block 2-4, the check code block Q-1, the check code block P-1, and the check code block Q-2)/8 data code blocks=1.

Decoding method 4: recovering the data code block 1-2 using the exclusive OR equation corresponding to the eighth row of the check matrix, and recovering the data code block 1-3 by using the exclusive OR equation corresponding to the seventh row of the check matrix.

A recovery overhead=(the check code block P-4, the check code block Q-3, the data code block 2-3, the check code block Q-1, the data code block 2-4, the check code block P-1, and the check code block Q-2)/8 data code blocks=0.875.

It can be learned that the recovery overhead of the decoding method 2 is lowest. Therefore, when a data chunk 2 is damaged, a storage controller may preferably use the decoding method 2 to complete recovery of the data chunk 2, so as to improve recovery efficiency.

When each chunk is damaged, there is at least one decoding method with a minimal quantity of code blocks that need to be read. Therefore, the storage controller may store multiple decoding methods with a lowest recovery overhead, and different decoding methods with the lowest recovery overhead are corresponding to a check matrix with different values of K and R.

The foregoing describes a scenario in which only one SSD in the K+2 SSDs is damaged. If two SSDs in the K+2 SSDs are damaged, a decoding method is similar to the foregoing encoding method, that is, a chunk stored on the two damaged SSDs is considered as the check chunk, and a chunk stored on K undamaged SSDs is considered as the data chunk. Decoding is performed according to the check matrix and the chunk stored on the K undamaged SSDs to obtain the check chunk stored on the two damaged SSDs.

There is a strong coupling between the erasure code encoding and decoding methods. For example, if a data code block 1-1=a check code block P-4 XOR a check code block Q-3 during encoding, the data code block 1-1 XOR the check code block Q-3 needs to be used to recover the check code block P-4 if the check code block P-4 is damaged, and the data code block 1-1 XOR the check code block P-4 needs to be used to recover the check code block Q-3 if the check code block Q-3 is damaged. Therefore, according to the decoding method provided in this application, a recovery overhead is effectively reduced, and efficiency during subsequent recovery of a damaged chunk is improved.

Figure 6:
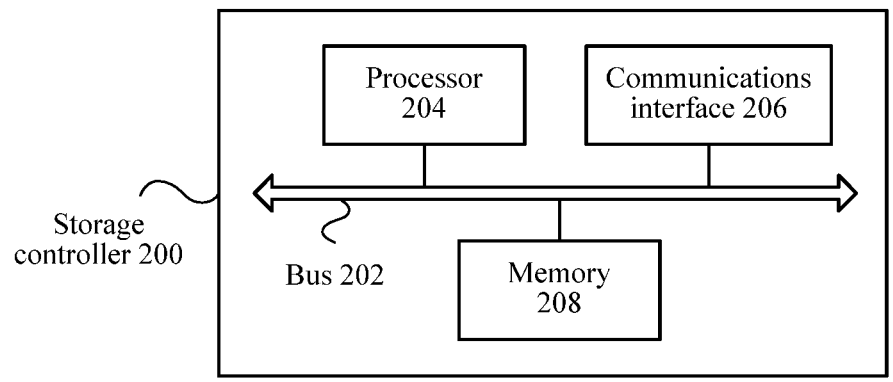
FIG. 6 is a schematic structural composition diagram of a storage controller according to an embodiment of this application.

As shown in FIG. 6, a storage controller 200 is provided. The storage controller 200 may be applied to the storage system shown in FIG. 1-1 or FIG. 1-2. The storage controller 200 includes a bus 202, a processor 204, a memory 208, and a communications interface 206. The processor 204, the memory 208, and the communications interface 206 communicate with each other by using the bus 202.

The processor 204 may be a central processing unit (CPU). The memory 208 may include a volatile memory, for example, a random access memory (RAM). The memory 208 may further include a non-volatile memory, for example, a read-only memory (ROM), a flash memory, an HDD, or an SSD.

The communications interface 206 includes a network interface and a read/write interface of a storage medium, which are respectively configured to obtain to-be-written data sent by a client and write a chunk group obtained after encoding into the storage medium.

Figure 7:
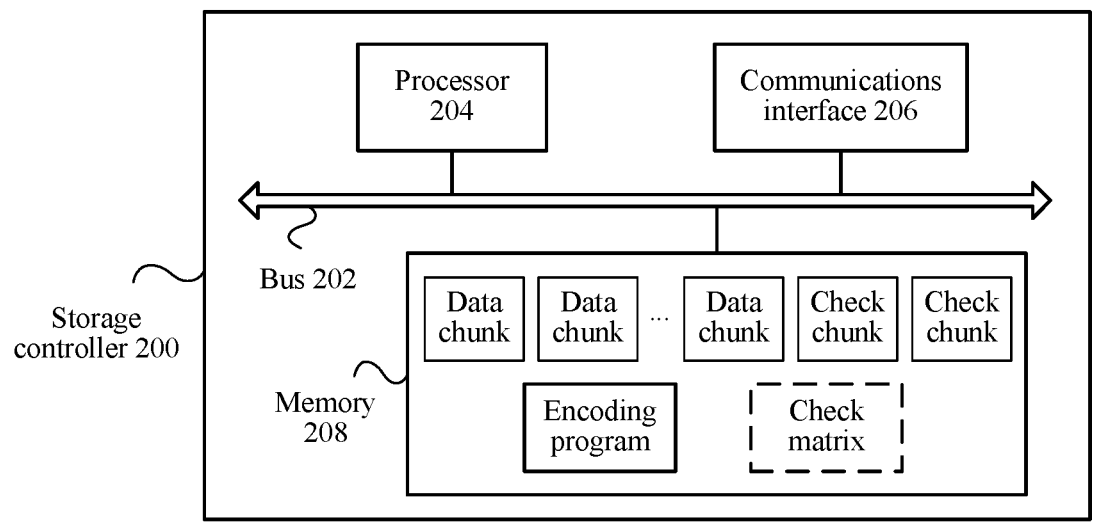
FIG. 7 is a schematic structural composition diagram of another storage controller according to an embodiment of this application.

As shown in FIG. 7, when the storage controller 200 executes an encoding process, the memory 208 stores an encoding program and K data chunks.

When the storage controller 200 runs, the processor 204 reads the encoding program and the K data chunks from the memory 208, so as to execute the foregoing encoding process to generate a chunk group, and stores each chunk in the chunk group into different storage media by using the communications interface 206.

Figure 8:
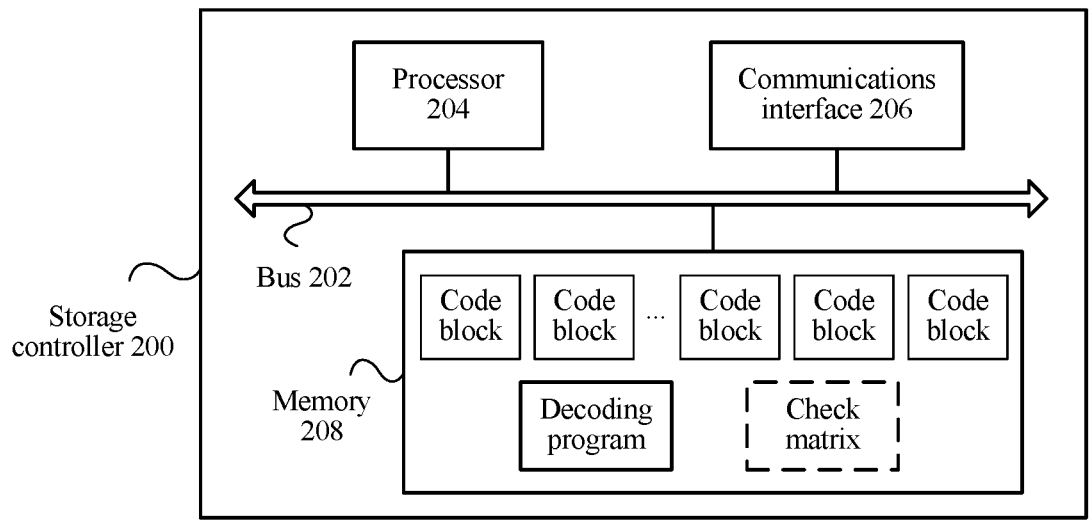
FIG. 8 is a schematic structural composition diagram of still another storage controller according to an embodiment of this application.

As shown in FIG. 8, when the storage controller 200 executes a decoding process, the memory 208 stores a decoding program and a code block required in a recovery process.

When a storage medium in a storage system in which the storage controller 200 is located is damaged, the processor 204 reads, from the memory 208, the decoding program and the code block required to recover the damaged storage medium, so as to execute the foregoing decoding process to recover a chunk stored on the damaged storage medium.

The encoding program and the decoding program may be merged into one program.

A check matrix is stored in the memory 208 in multiple manners. The check matrix may be directly stored in a form of a matrix, or may be stored in a form of 2*R exclusive OR equations. In addition, the 2*R exclusive OR equations are integrated in the encoding program and the decoding program.

When the check matrix is stored in a form of a matrix, in the encoding process, the processor 204 executes the encoding program. After accessing the check matrix to determine a start encoding row, after each time performing an exclusive OR operation corresponding to a row of the check matrix, the processor 204 accesses the check matrix again to perform an exclusive OR operation corresponding to another row of the check matrix until an exclusive OR operation corresponding to each row of the check matrix is performed. The decoding process is similar to the encoding process.

Each check matrix may have determined encoding and decoding processes. Therefore, the memory 208 may not store the check matrix; instead, the 2*R exclusive OR equations are directly stored in the encoding program and the decoding program. For example, in the encoding method corresponding to FIG. 5, the encoding program directly instructs to perform step 1.1, steps 2.1 to 2.3, step 3.1, and steps 4.1 to 4.3 without storing the check matrix, and the check matrix is accessed row by row in the encoding process, to determine two specific code blocks on which an exclusive OR operation needs to be performed in each step. Similarly, a decoding method with a lowest recovery overhead may be directly stored in the decoding program. For example, when K=2, R=4, and a standard check matrix is used, if a data chunk 1 is damaged, to recover a data code block 1-1 to a data code block 1-4, the decoding program directly instructs to perform the following exclusive OR operations: the data code block 1-1=a check code block P-4 XOR a check code block Q-3; the data code block 1-2=a data code block 2-3 XOR the check code block P-4; the data code block 1-3=a data code block 2-2 XOR a check code block P-1; and the data code block 1-4=the check code block P-1 XOR a check code block Q-2.

The storage controller provided above reduces a recovery overhead, and improves efficiency during subsequent recovery of a damaged chunk.

Figure 9:
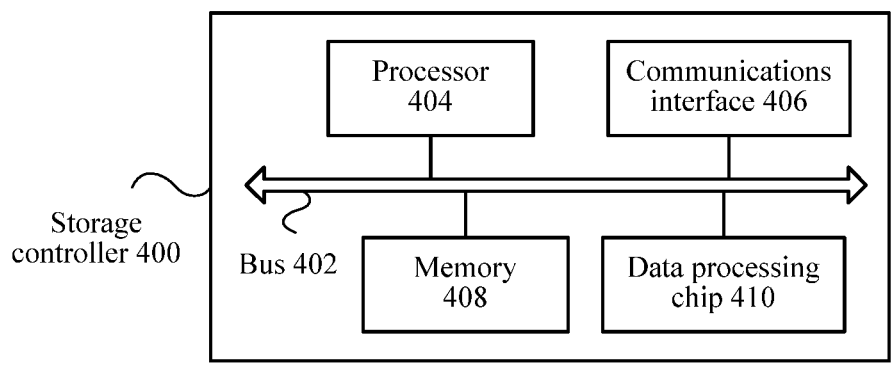
FIG. 9 is a schematic structural composition diagram of yet another storage controller according to an embodiment of this application.

As shown in FIG. 9, another storage controller 400 is provided. The storage controller 400 may be applied to the storage system shown in FIG. 1-1 or FIG. 1-2. The storage controller 400 includes a bus 402, a processor 404, a memory 408, a data processing chip 410, and a communications interface 406. The processor 404, the memory 408, and the communications interface 406 communicate with each other by using the bus 402.

The processor 404 may be a CPU. The memory 408 may include a volatile memory. The memory 408 may further include a non-volatile memory.

The communications interface 406 includes a network interface and a read/write interface of a storage medium, which are respectively configured to obtain to-be-written data sent by a client and store a chunk group obtained after encoding into the storage medium.

The data processing chip 410 may be implemented by using a circuit, and the circuit may be an application-specific integrated circuit (ASIC), or a programmable logic device PLD). The PLD may be a complex programmable logical device (CPLD), a field-programmable gate array (FPGA), a generic array logic (GAL), or any combination thereof.

Figure 10:
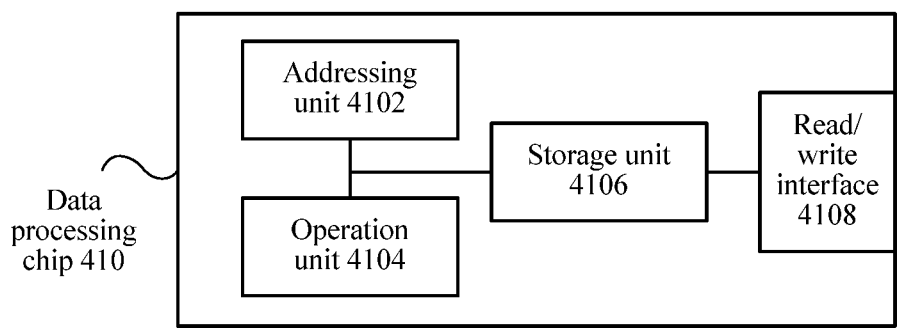
FIG. 10 is a schematic structural composition diagram of a data processing chip according to an embodiment of this application.

As shown in FIG. 10, the data processing chip 410 may specifically include an addressing unit 4102, an operation unit 4104, a storage unit 4106, and a read/write interface 4108. The addressing unit 4102, the operation unit 4104, and the storage unit 4106 may be actually integrated into a circuit.

The read/write interface 4108 is connected to the bus 402, and is configured to: in a scenario in which the data processing chip 410 performs encoding, obtain, using the bus 402, a data code block stored in the memory 408 and store the data code block into the storage unit 4106, and send, to the memory 208 and by using the bus 402, a check code block obtained after the encoding, so that the storage controller 200 stores a chunk group into a storage medium. The read/write interface 4108 is further configured to: in a scenario in which the data processing chip 410 performs decoding, obtain, using the bus 402, a code block required in a recovery process, store the code block into the storage unit 4106, and send the recovered code block to the memory 208 by using the bus 402.

A function of the addressing unit 4102 is similar to that of a check matrix. The addressing unit 4102 determines two specific code blocks that are in the storage unit 4106 and on which the operation unit 4104 performs, in a process of performing an exclusive OR operation, the exclusive OR operation, so that the operation unit 4104 obtains corresponding code blocks from the storage unit 4106 to complete the exclusive OR operation.

The operation unit 4104 obtains, from the storage unit 4106, the two code blocks on which the exclusive OR operation needs to be performed in the process of the exclusive OR operation, and stores an obtained code block into the storage unit 4106 after performing an exclusive OR operation, and then performs a next exclusive OR operation.

Because of a strong coupling between erasure code encoding and decoding methods, the storage controller provided in this application effectively reduces a recovery overhead, and improves efficiency during subsequent recovery of a damaged chunk.

In the foregoing embodiments, the description of each embodiment has respective focuses. For a part that is not described in detail in an embodiment, reference may be made to related descriptions in other embodiments.

The method described in combination with the disclosed content in this application may be implemented in a manner of executing a software instruction by a processor. The software instruction may include a corresponding software module. The software module may be stored in a RAM, a flash memory, a ROM, an erasable programmable read only memory (EPROM), an electrically erasable programmable read only memory (EEPROM), an HDD, an SSD, an optical disc, or a storage medium in any other forms well-known in the aft.

A person skilled in the art should be aware that in the foregoing one or more examples, functions described in this application may be implemented by hardware or software. When the present application is implemented by software, the foregoing functions may be stored in a computer-readable medium or transmitted as one or more instructions or code in the computer-readable medium. The storage medium may be any available medium accessible to a general-purpose or dedicated computer.

The objectives, technical solutions, and benefits of this application are further described in detail in the foregoing specific embodiments. It should be understood that the foregoing descriptions are merely specific embodiments of this application, but are not intended to limit the protection scope of this application. Any modification or improvement made within the spirit and principle of the present application shall fall within the protection scope of this application.

What is claimed is:

1. A first storage controller, comprising:
a processor; and
a non-transitory memory;
wherein the first storage controller is comprised in a storage system, the storage system comprises at least one storage device, a first storage device of the at least one storage device comprises the first storage controller and a first storage medium, each storage device of the at least one storage device comprised in the storage system comprises a storage controller and a storage medium, and each storage device of the at least one storage device comprised in the storage system is configured to connect with any other storage device comprised in the storage system;
wherein the processor is configured to execute a program in the non-transitory memory to:
receive to-be-written data;
divide the to-be-written data into K to-be-coded data chunks, wherein each data chunk of the K to-be-coded data chunks comprises R data code blocks, (R+1) is a prime number, and (R+1)>K;
generate a first check chunk and a second check chunk according to a check matrix and the K to-be-coded data chunks, wherein each of the first check chunk and the second check chunk respectively comprises R check code blocks;
create a chunk group, wherein the chunk group comprises the K to-be-coded data chunks, the first check chunk, and the second check chunk; and
store each data chunk in the chunk group into the first storage medium, and store each check chunk in the chunk group into a second storage medium;
wherein the check matrix comprises 2*R rows and (K+2)*R columns, each column of the check matrix corresponds to one code block, each row of the check matrix corresponds to one exclusive OR equation the (K*R+1)$^{th}$ column to the ((K+1)*R)$^{th}$ column of the check matrix form a chunk column set of the first check chunk, and the ((K+1)*R+1)$^{th}$ column to the ((K+2)*R)$^{th}$ column of the check matrix form a chunk column set of the second check chunk;
wherein the check matrix is a standard check matrix H, or the check matrix is obtained after N exchange operations are performed on the standard check matrix H,
wherein N≥1, and the N exchange operations are each an exchange of any two chunk column sets;
wherein, for each value of i and each value of j, coordinates in the standard check matrix H corresponding to the following first relations are set to be 1:

when $i<j$, $H[i+1][j*R+(R-j+i) \bmod R+1]$, and $H[R+i+1][(j+1)*R-(R-j+i) \bmod R]$; or when $i>j$, $H[i+1][j*R+(R-1-j+i) \bmod R+1]$, and $H[R+i+1][(j+1)*R-(R-1-j+i) \bmod R]$; and wherein 2*R≥i≥1, (K+2)*R≥j≥1, and coordinates in the in the standard check matrix H that do not correspond to the first relations are set to be o.

2. The first storage controller according to claim 1, wherein the ((k-1)*R+1)$^{th}$ column to the (k*R)$^{th}$ column of the check matrix form a chunk column set of the k$^{th}$ data chunk in the K to-be-coded data chunks, wherein K≥k≥1, the ((k-1)*R+1)$^{th}$ column to the (k*R)$^{th}$ column of the check matrix respectively correspond to the R data code blocks of the k$^{th}$ data chunk in the K to-be-coded data chunks, the (K*R+1)$^{th}$ column to the ((K+1)*R)$^{th}$ column of the check matrix respectively correspond to the R check code blocks of the first check chunk, and the ((K+1)*R+1)$^{th}$ column to the ((K+2)*R)$^{th}$ column of the check matrix respectively correspond to the R check code blocks of the second check chunk; and
wherein there are three coordinates of 1 in a D$^{th}$ row of the check matrix, wherein the D$^{th}$ row is any row of the check matrix, and an exclusive OR operation is performed on any two of three code blocks corresponding to the coordinates of 1 in the D$^{th}$ row of the check matrix, based on the OR equation of the D$^{th}$ row, to obtain a code block that does not participate in this exclusive OR operation and that is in the three code blocks corresponding to the coordinates of 1 in the D$^{th}$ row of the check matrix.

3. The first storage controller according to claim 1, wherein the processor is further configured to separately store the K to-be-coded data chunks, the first check chunk, and the second check chunk into K+2 storage media in the storage system in which the first storage controller is located.

4. The first storage controller according to claim 3, wherein the processor is further configured to:
when a storage medium in the (K+2) storage media is damaged, recover the damaged storage medium according to the check matrix, a data chunk that is stored on an undamaged storage medium in the (K+2) storage media, and the first check chunk or the second check chunk.

5. A data processing chip, comprising:
a circuit; and
an interface, configured to perform read and write operations;
wherein the data processing chip is comprised in a storage system, the storage system comprises at least one storage device, a first storage device of the at least one storage device comprises a first storage controller and a first storage medium, the first storage controller comprises the data processing chip, and each storage device of the at least one storage device comprised in the storage system comprises a storage controller and a storage medium;

wherein the circuit is configured to:
receive to-be-written data;
divide the to-be-written data into K to-be-coded data chunks, wherein each data chunk of the K to-be-coded data chunks comprises R data code blocks, (R+1) is a prime number, and (R+1)>K;
generate a first check chunk and a second check chunk based on a check matrix and the K to-be-coded data chunks, wherein each of the first check chunk and the second check chunk respectively comprises R check code blocks;
create a chunk group, wherein the chunk group comprises the K data chunks, the first check chunk, and the second check chunk; and
store each data chunk in the chunk group into the first storage medium, and store each check chunk into a second storage medium;
wherein the check matrix comprises 2*R rows and (K+2)*R columns, each column of the check matrix corresponds to one code block, and each row of the check matrix corresponds to one exclusive OR equation, and wherein the $(K*R+1)^{th}$ column to the $((K+1)*R)^{th}$ column of the check matrix form a chunk column set of the first check chunk, and the $((K+1)*R+1)^{th}$ column to the $((K+2)*R)^{th}$ column of the check matrix form a chunk column set of the second check chunk;
wherein the check matrix is a standard check matrix H, or the check matrix is obtained after N exchange operations are performed on the standard check matrix H, wherein N≥1, and each of the N exchange operations is an exchange of any two chunk column sets;
wherein, for each value of i and each value of j, coordinates in the standard check matrix H corresponding to the following first relations are set to be 1:

when $i<j$, $H[i+1][j*R+(R-j+i) \bmod R+1]$, and $H[R+i+1][(j+1)*R-(R-j+i) \bmod R]$; or when $i>j$, $H[i+1][j*R+(R-1-j+i) \bmod R+1]$, and $H[R+i+1][(j+1)*R-(R-1-j+i) \bmod R]$; and wherein 2*R≥i≥1, (K+2)*R≥j≥1, and coordinates in the in the standard check matrix H that do not correspond to the first relations are set to be o.

6. The data processing chip according to claim 5, wherein the $((k-1)*R+1)^{th}$ column to the $(k*R)^{th}$ column of the check matrix form a chunk column set of the $k^{th}$ data chunk in the K to-be-coded data chunks, wherein K≥k≥1, the $((k-1)*R+1)^{th}$ column to the $(k*R)^{th}$ column of the check matrix respectively correspond to the R data code blocks of the $k^{th}$ data chunk in the K to-be-coded data chunks, the $(K*R+1)^{th}$ column to the $((K+1)*R)^{th}$ column of the check matrix respectively correspond to the R check code blocks of the first check chunk, and the $((K+1)*R+1)^{th}$ column to the $((K+2)*R)^{th}$ column of the check matrix respectively correspond to the R check code blocks of the second check chunk; and
wherein there are three coordinates of 1 in a $D^{th}$ row of the check matrix, wherein the $D^{th}$ row is any row of the check matrix, and the circuit performs an exclusive OR operation on any two of three code blocks corresponding to the coordinates of 1 in the $D^{th}$ row of the check matrix, based on the XOR equation of the $D^{th}$ row to obtain a code block that does not participate in this exclusive OR operation and that is in the three code blocks corresponding to the coordinates of 1 in the $D^{th}$ row of the check matrix.

7. The data processing chip according to claim 5, wherein the circuit is further configured to store the K to-be-coded data chunks, the first check chunk, and the second check chunk into a memory in the first storage controller, so that the first storage controller separately stores the K to-be-coded data chunks, the first check chunk, and the second check chunk into K+2 storage media in the storage system in which the first storage controller is located.

8. The data processing chip according to claim 7, wherein the circuit is further configured to:
when a storage medium in the (K+2) storage media is damaged, recover the damaged storage medium according to the check matrix, a data chunk that is stored on an undamaged storage medium in the (K+2) storage media, and the first check chunk or the second check chunk.

9. The data processing chip according to claim 5, wherein the data processing chip comprises a field-programmable gate array (FPGA).

10. The first storage controller according to claim 1, the step of dividing comprises:
when a quantity of received to-be-written data reaches a preset value, divide the to-be-written data into K to-be-coded data chunks.

11. A method comprising:
receiving, by a first storage controller, to-be-written data, wherein the first storage controller is comprised in a storage system, the storage system comprises at least one storage device, a first storage device of the at least one storage device comprises the first storage controller and a first storage medium, each storage device of the at least one storage device comprised in the storage system comprises a storage controller and a storage medium, and each storage device of the at least one storage device comprised in the storage system is configured to connect with any other storage device comprised in the storage system;
dividing, by the first storage controller, the to-be-written data into K to-be-coded data chunks wherein each data chunk of the K to-be-coded data chunks comprises R data code blocks, (R+1) is a prime number, and (R+1) >K;
generating, by the first storage controller, a first check chunk and a second check chunk according to a check matrix and the K to-be-coded data chunks, wherein each of the first check chunk and the second check chunk respectively comprises R check code blocks;
creating, by the first storage controller, a chunk group, wherein the chunk group comprises the K to-be-coded data chunks, the first check chunk, and the second check chunk; and
storing, by the first storage controller, each data chunk in the chunk group into the first storage medium, and storing, by the first storage controller, each check chunk in the chunk group into a second storage medium;
wherein the check matrix comprises 2*R rows and (K+2)*R columns, each column of the check matrix corresponds to one code block, and each row of the check matrix corresponds to one exclusive OR equation, and wherein the $(K*R+1)^{th}$ column to the $((K+1)*R)^{th}$ column of the check matrix form a chunk column set of the first check chunk, and the $((K+1)*R+1)^{th}$ column to the $((K+2)*R)^{th}$ column of the check matrix form a chunk column set of the second check chunk;

wherein the check matrix is a standard check matrix H, or the check matrix is obtained after N exchange operations are performed on a standard check matrix H, wherein N≥1, and each of the N exchange operations is an exchange of any two chunk column sets;

wherein, for each value of i and each value of j, coordinates in the standard check matrix H corresponding to the following first relations are set to be 1:

when $i<j$, $H[i+1][j*R+(R-j+i)\bmod R+1]$, and $H[R+i+1][(j+1)*R-(R-j+i)\bmod R]$; or when $i>j$, $H[i+1][j*R+(R-1-j+i)\bmod R+1]$, and $H[R+i+1][(j+1)*R-(R-1-j+i)\bmod R]$; and wherein 2*R≥i≥1, (K+2)*R≥j≥1, and coordinates in the in the standard check matrix H that do not correspond to the first relations are set to be o.

12. The method according to claim 11, wherein the $((k-1)*R+1)^{th}$ column to the $(k*R)^{th}$ column of the check matrix form a chunk column set of the $k^{th}$ data chunk in the K to-be-coded data chunks, wherein K≥k≥1, the $((k-1)*R+1)^{th}$ column to the $(k*R)^{th}$ column of the check matrix respectively correspond to the R data code blocks of the $k^{th}$ data chunk in the K to-be-coded data chunks, the $(K*R+1)^{th}$ column to the $((K+1)*R)^{th}$ column of the check matrix respectively correspond to the R check code blocks of the first check chunk, and the $((K+1)*R+1)^{th}$ column to the $((K+2)*R)^{th}$ column of the check matrix respectively correspond to the R check code blocks of the second check chunk; and wherein there are three coordinates of 1 in a $D^{th}$ row of the check matrix, wherein the $D^{th}$ row is any row of the check matrix, and an exclusive OR operation is performed on any two of three code blocks corresponding to the coordinates of 1 in the $D^{th}$ row of the check matrix, based on the OR equation of the $D^{th}$ row, to obtain a code block that does not participate in this exclusive OR operation and that is in the three code blocks corresponding to the coordinates of 1 in the $D^{th}$ row of the check matrix.

13. The method according to claim 11, further comprising:

separately storing the K to-be-stored data chunks, the first check chunk, and the second check chunk into (K+2) storage media in the storage system in which the first storage controller is located.

14. The method according to claim 13, further comprising:

when a storage medium in the (K+2) storage media is damaged, recovering the damaged storage medium according to the check matrix, a data chunk that is stored on an undamaged storage medium in the (K+2) storage media, and the first check chunk or the second check chunk.

15. The method according to claim 11, wherein the dividing comprises:

when a quantity of received to-be-written data reaches a preset value, divide the to-be-written data into K to-be-coded data chunks.

16. A non-transitory computer-readable storage medium comprising instructions which, when executed by a first computer, cause the computer to:

receive to-be-written data;

divide the to-be-written data into K to-be-coded data chunks, wherein each data chunk of the K to-be-coded data chunks comprises R data code blocks, (R+1) is a prime number, and (R+1)>K;

generate a first check chunk and a second check chunk according to a check matrix and the K to-be-coded data chunks, wherein each of the first check chunk and the second check chunk comprises R check code blocks;

create a chunk group, wherein the chunk group comprises the K to-be-coded data chunks, the first check chunk, and the second check chunk; and store each data chunk in the chunk group into a first storage medium, and store each check chunk in the chunk group into a second storage medium;

wherein the first computer is comprised in a storage system, the storage system comprises at least one computer including the first computer, each computer comprises a storage controller and a storage medium, the first computer comprises a first storage controller and the first storage medium, and each computer comprised in the storage system is configured to connect with any other computer comprised in the storage system;

wherein the check matrix comprises 2*R rows and (K+2)*R columns, each column of the check matrix corresponds to one code block, and each row of the check matrix corresponds to one exclusive OR equation, and wherein the $(K*R+1)^{th}$ column to the $((K+1)*R)^{th}$ column of the check matrix form a chunk column set of the first check chunk, and the $((K+1)*R+1)^{th}$ column to the $((K+2)*R)^{th}$ column of the check matrix form a chunk column set of the second check chunk; and the check matrix is a standard check matrix H, or the check matrix is obtained after N exchange operations are performed on a standard check matrix H, wherein N≥1, and each of the N exchange operations is an exchange of any two chunk column sets; and wherein, for each value of i and each value of j, coordinates in the standard check matrix H corresponding to the following first relations are set to be 1:

when $i<j$, $H[i+1][j*R+(R-j+i)\bmod R+1]$, and $H[R+i+1][(j+1)*R-(R-j+i)\bmod R]$; or when $i>j$, $H[i+1][j*R+(R-1-j+i)\bmod R+1]$, and $H[R+i+1][(j+1)*R-(R-1-j+i)\bmod R]$; and wherein 2*R≥i≥1, (K+2)*R≥j≥1, and coordinates in the in the standard check matrix H that do not correspond to the first relations are set to be o.

17. The non-transitory computer-readable storage medium according to claim 16, wherein the $((k-1)*R+1)^{th}$ column to the $(k*R)^{th}$ column of the check matrix form a chunk column set of the $k^{th}$ data chunk in the K to-be-coded data chunks, wherein K≥k≥1, the $((k-1)*R+1)^{th}$ column to the $(k*R)^{th}$ column of the check matrix respectively correspond to the R data code blocks of the $k^{th}$ data chunk in the K data chunks, the $(K*R+1)^{th}$ column to the $((K+1)*R)^{th}$ column of the check matrix respectively correspond to the R check code blocks of the first check chunk, and the $((K+1)*R+1)^{th}$ column to the $((K+2)*R)^{th}$ column of the check matrix respectively correspond to the R check code blocks of the second check chunk; and wherein there are three coordinates of 1 in a $D^{th}$ row of the check matrix, wherein the $D^{th}$ row is any row of the check matrix, and an exclusive OR operation is performed on any two of three code blocks corresponding to the coordinates of 1 in the $D^{th}$ row of the check matrix, based on the OR equation of the $D^{th}$ row, to obtain a code block that does not participate in this exclusive OR operation and that is in the three code blocks corresponding to the coordinates of 1 in the $D^{th}$ row of the check matrix.

18. The non-transitory computer-readable storage medium according to claim 16, further comprising:

separately storing the K to-be-coded data chunks, the first check chunk, and the second check chunk into (K+2) storage media in the storage system in which the first computer is located.

19. The non-transitory computer-readable storage medium according to claim 18, further comprising:

when a storage medium in the (K+2) storage media is damaged, recovering the damaged storage medium according to the check matrix, a data chunk that is stored on an undamaged storage medium in the (K+2) storage media, and the first check chunk or the second check chunk.

20. The non-transitory computer-readable storage medium according to claim 18, wherein the dividing comprises:

when a quantity of received to-be-written data reaches a preset value, divide the to-be-written data into K to-be-coded data chunks.

* * * * *